United States Patent [19]
Oliboni et al.

[11] Patent Number: 5,111,486
[45] Date of Patent: May 5, 1992

[54] BIT SYNCHRONIZER

[75] Inventors: Mark L. Oliboni, Boynton Beach; Stephen H. Woltz; George A. Drapac, both of Boca Raton; Walter L. Davis, Coral Springs, all of Fla.

[73] Assignee: Motorola, Inc., Schaumburg, Ill.

[21] Appl. No.: 324,277

[22] Filed: Mar. 15, 1989

[51] Int. Cl.$^5$ .............................................. H04L 7/10
[52] U.S. Cl. ...................................... 375/120; 360/51
[58] Field of Search ............ 375/119, 120, 106, 118; 331/1 A; 360/51

[56] References Cited

U.S. PATENT DOCUMENTS

| | | | |
|---|---|---|---|
| 4,280,099 | 7/1981 | Rattlingourd et al. | 375/119 |
| 4,506,262 | 3/1985 | Vance et al. | 375/114 |
| 4,518,961 | 5/1985 | Davis et al. | 340/825.44 |
| 4,534,044 | 8/1985 | Funke et al. | 375/120 |
| 4,590,602 | 5/1986 | Wolaver | 375/120 |
| 4,644,419 | 2/1987 | Iikuma et al. | 360/51 |
| 4,724,493 | 2/1988 | Nakamura | 360/51 |
| 4,808,884 | 2/1989 | Hull et al. | 375/120 |

Primary Examiner—Douglas W. Olms
Attorney, Agent, or Firm—Vincent B. Ingrassia; William E. Koch; Gregg E. Rasor

[57] ABSTRACT

A paging receiver capable of bit synchronizing to one of two data rates. The receiver has a digital phase locked loop integrated onto a single integrated circuit clocked by a single frequency crystal. The paging receiver receives and synchronizes to a POCSAG signal which may be transmitted at either 512 bits per second or 1200 bits per second. The digital phase locked loop bit synchronizes to either data rate using a single crystal frequency of 76.8 kHz. The data rate is selected by a bit in the code paging receiver's code plug. The digital phase locked loop is constructed to have a substantially constant frequency to bandwidth ratio at both data rates.

11 Claims, 3 Drawing Sheets

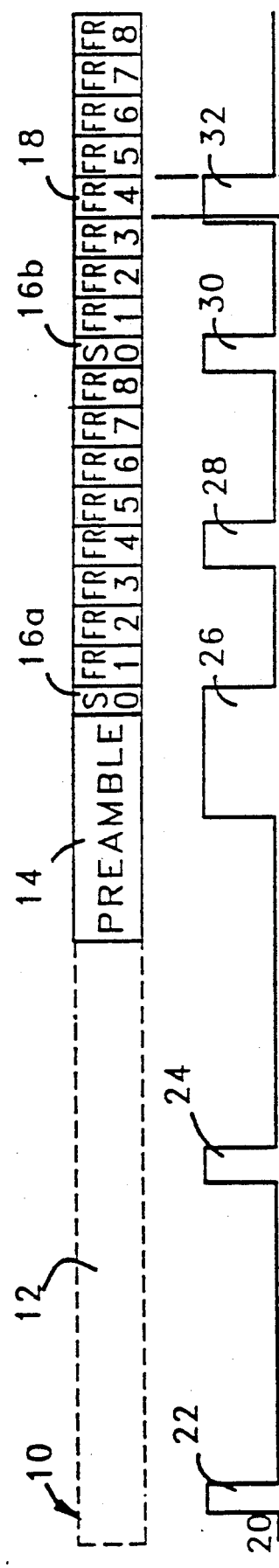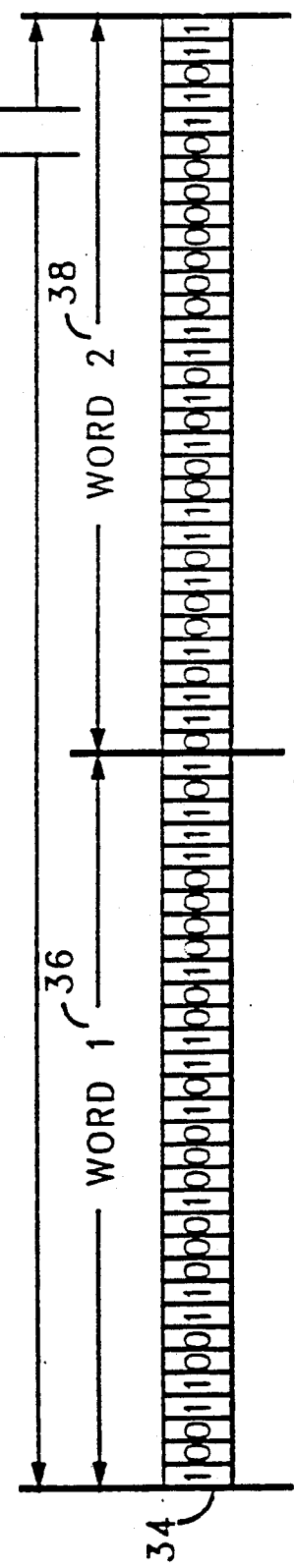
FIG.1A
FIG.1B
FIG.1C — PRIOR ART —

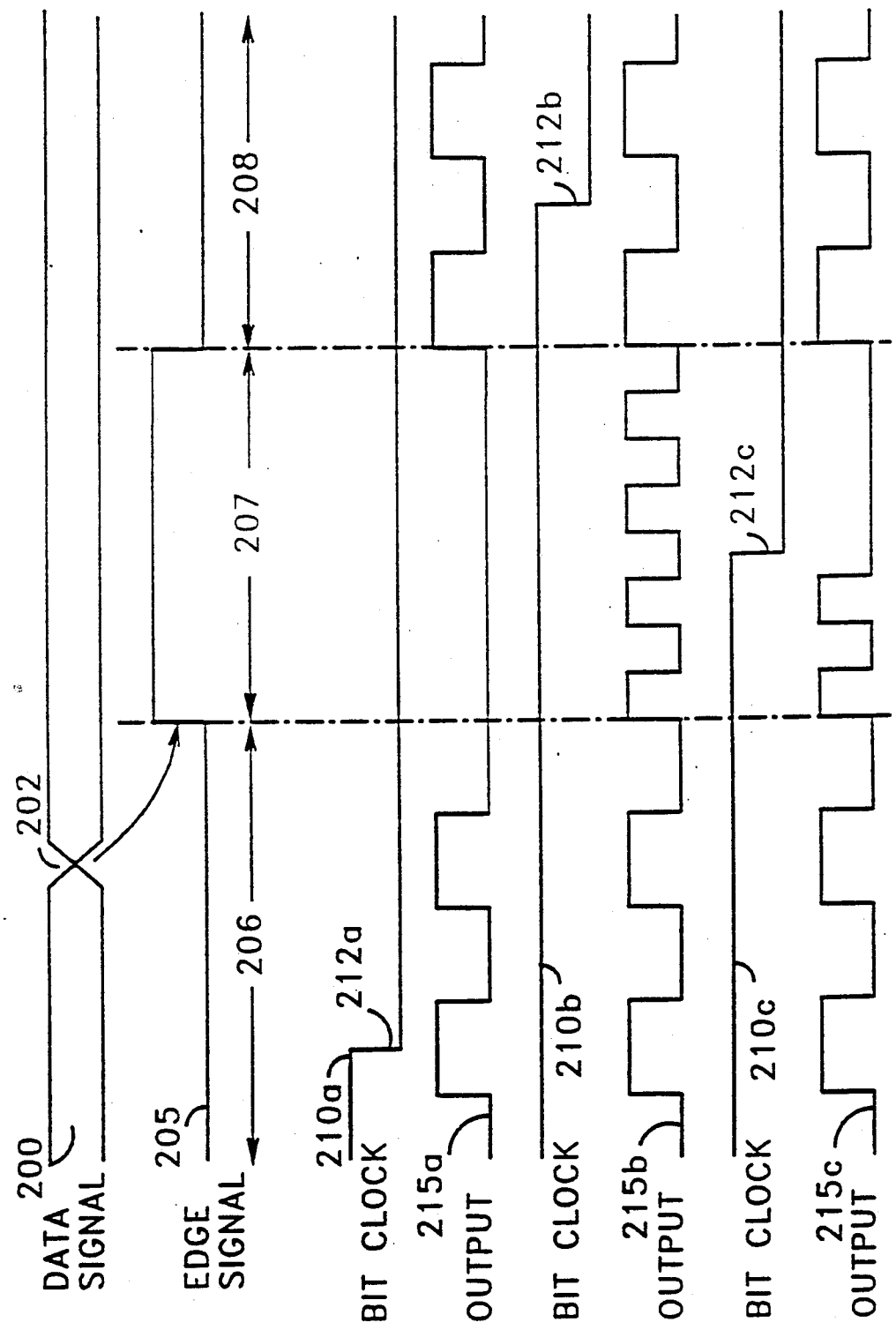

BIT SYNCHRONIZER

BACKGROUND OF THE INVENTION

1. Field of the Invention

This invention relates generally to the area of bit synchronizing to data transmissions received by a data receiver. Particularly this invention relates to a digital phase locked loop bit synchronizer for use in a portable paging receiver.

2. Description of the Prior Art

Bit synchronization to a digital transmission is a process used to determine bit boundaries of a data transmission and thereafter to synchronously sample bits of data from the data transmission. Bit synchronization may be used in a paging receiver which decodes a digital signaling protocol proposed by British Telecom in England which is commonly termed POCSAG (Post Office Code Standardization Advisory Group).

Synchronization to this protocol is known and has been described in detail in U.S. Pat. No. 4,518,961, May 21, 1985, to Davis et al. which shows synchronization to either the POCSAG or a Golay signalling protocols. Additionally, U.S. Pat. No. 4,506,262, Mar. 19, 1985 to Vance et al. shows synchronization to POCSAG using an early/late phase locked loop with coarse and fine synchronization modes.

Line 10 of FIG. 1 shows a typical POCSAG signal. Prior to the signal, noise or another type of protocol may be transmitted as shown in area 12 enclosed in a broken line. The POCSAG signal begins with a preamble signal, 14, which consists of a number of one-zero transitions. The preamble is followed by a plurality of thirty two bit information words, each coded in a 31,21 extended BCH code (32,21). The information words begin with a sync code word 16a which contains predetermined binary sequence. Every seventeenth word thereafter another sync code, 16b, occurs in the signal. Between sync codes, the information is structured as 8 information frames each of which contain two (32,21) words. For illustration, the contents of frame 4, as indicated by numeral 18, is shown on line 34. Line 34 has two 32 bit words, 36 and 38, each information word having 32 data bits structured in the (32,21) format. It can be appreciated that when viewed as an unsynchronized data signal, the bit sequence shown on line 34 appears to be a random bit sequence.

The sync code provides a means for frame synchronization to the signal. Thus it is desirable to first bit synchronize to the preamble signal and subsequently frame synchronize to the sync code. Line 20 shows the operation of a pager synchronizing to the POCSAG signal. During interval 22 and 24, the pager is attempting to synchronize to the signal. However, the signal is not present. During interval 26, the preamble signal, 14, is present, the pager bit synchronizes and finds sync code 16a. Then in a known manner, the pager decodes information in preassigned frame 4 as shown by intervals 28 and 32. The pager also tests for sync code 16b during interval 30.

In some instances, the preamble signal may be corrupted by noise rendering the the preamble signal undetectable. In this situation, it is desirable to acquire bit synchronization on the data bits within the thirty two bit words, and subsequently frame synchronize to one of the periodic sync code signals 16b. The bit synchronization process in this mode is more difficult because the data in the thirty two bit words is effectively random. Consequently, it is desirable to provide a selective call receiver capable of acquiring bit synchronization on either a POCSAG preamble signal or data signals within POCSAG information words.

The POCSAG protocol may be transmitted at one of two data rates, 512 bits per second, or 1200 bits per second. It would be very desirable to selected the data rate at which a paging receiver operates at the point of sale. This selection may be jumper selected or programmed into the pager code plug. Consequently, it is desirable to provide a selective call receiver having a phase locked loop clocked by a single frequency which may be configured to operate at either data rate. Additionally, to provide for substantially identical operating characteristics at both data rates, it is desirable to maintain a constant bandwidth to data rate ratio of the phase locked loop at both data rates.

Finally, in order to compete in the paging market, is desirable to produce paging receivers at a low cost. A low cost may be achieved by having a minimum number of component parts within the paging receiver. Thus it is desirable to construct the phase locked loop entirely on a single integrated circuit and clocked with a frequency generated with a single crystal while being able to synchronize at either data rate.

SUMMARY OF THE INVENTION

It is therefore an object of the present invention to provide a means for resolving the aforementioned issues.

An object of the present invention is to proved a digital phase locked loop (DPLL) capable of bit synchronizing on either a predetermined signal or a data signal.

Another object of the present invention is to provide a DPLL integrated on a single integrated circuit operating from a single input frequency. The DPLL being capable of bit synchronizing to at least two substantially unrelated bit rates using the single frequency input and a minimal amount of circuitry while maintaining a constant bandwidth to data rate ratio at each bit rate.

It is further an object of this invention to provide a programmable digital phase locked loop for synchronizing a data sample clock signal to a received data stream having two or more predetermined bit rates, said digital phase locked loop including an oscillator means for producing a stable reference frequency clock signal, a first divider means for generating two sub-harmonics of the oscillator signal; selector means for selecting either one of the two harmonic frequency signals, or a DC level as an input to a second divider; second dividing means for dividing the output of the selector means to generate a recovered sample clock signal; and phase detector or comparator means for comparing the relative phase of the recovered sample clock signal with the phase of the received data signal, the output of the phase detector also being interconnected to the selector means to effect the appropriate selection of one of the three clock source signals as needed to keep the sample clock signal "locked" to the received signal.

In accordance with the present invention, a digital phase locked loop for bit synchronizing to a binary signal having a predetermined bit rate is provided. The digital phase locked loop includes an oscillator means for producing a reference signal having a predetermined frequency. The digital phase locked loop further includes a frequency generating means responsive to the reference signal for generating an advance signal, a nominal signal, a retard signal and a sample signal wherein each generated signal is derived from the reference signal. The digital phase locked loop further includes an edge detecting means coupled to the binary signal and responsive to the sample signal for generating an edge signal having a period corresponding to one cycle of the sample clock in response to a transition of the binary signal. The digital phase locked loop further includes a dividing means for producing a bit clock signal having a frequency substantially equal to the bit rate. The digital phase locked loop further includes a selecting means having an output signal, wherein the output signal is selected to be equivalent to the nominal signal in the absence of the edge pulse signal, and the output signal is selected to be equal to either the advance signal or the retard signal in the presence of the edge signal, wherein the advance signal is selected in response to the bit clock being in a first state and the retard signal is selected in response to the bit clock being in a second state, and further wherein said dividing means produces the bit clock as a function of the output signal.

In accordance with the present invention, a method of controlling a receiver having a digital phase locked loop capable of being programmed to lock onto either a first or second predetermined data rate is shown. The digital phase locked loop is capable of being programmed to operate with either a first or second bandwidths. The receiver additionally has a memory means having a first and second states for determining the operation of the digital phase locked loop. The method comprises the steps of; reading the memory means and determining the state thereof, programming the digital phase locked loop to lock onto the first data rate and to operate at the first bandwidth if the memory means is in the first state, and programming the digital phase locked loop to lock onto the second data rate and to operate at the bandwidth if the memory means is in the second state.

BRIEF DESCRIPTION OF THE DRAWINGS

FIGS. 1A, 1B, 1C show a typical prior art POCSAG signal.

FIG. 3 shows a timing diagram related to FIG. 2.

DESCRIPTION OF A PREFERRED EMBODIMENT

Figure 2:
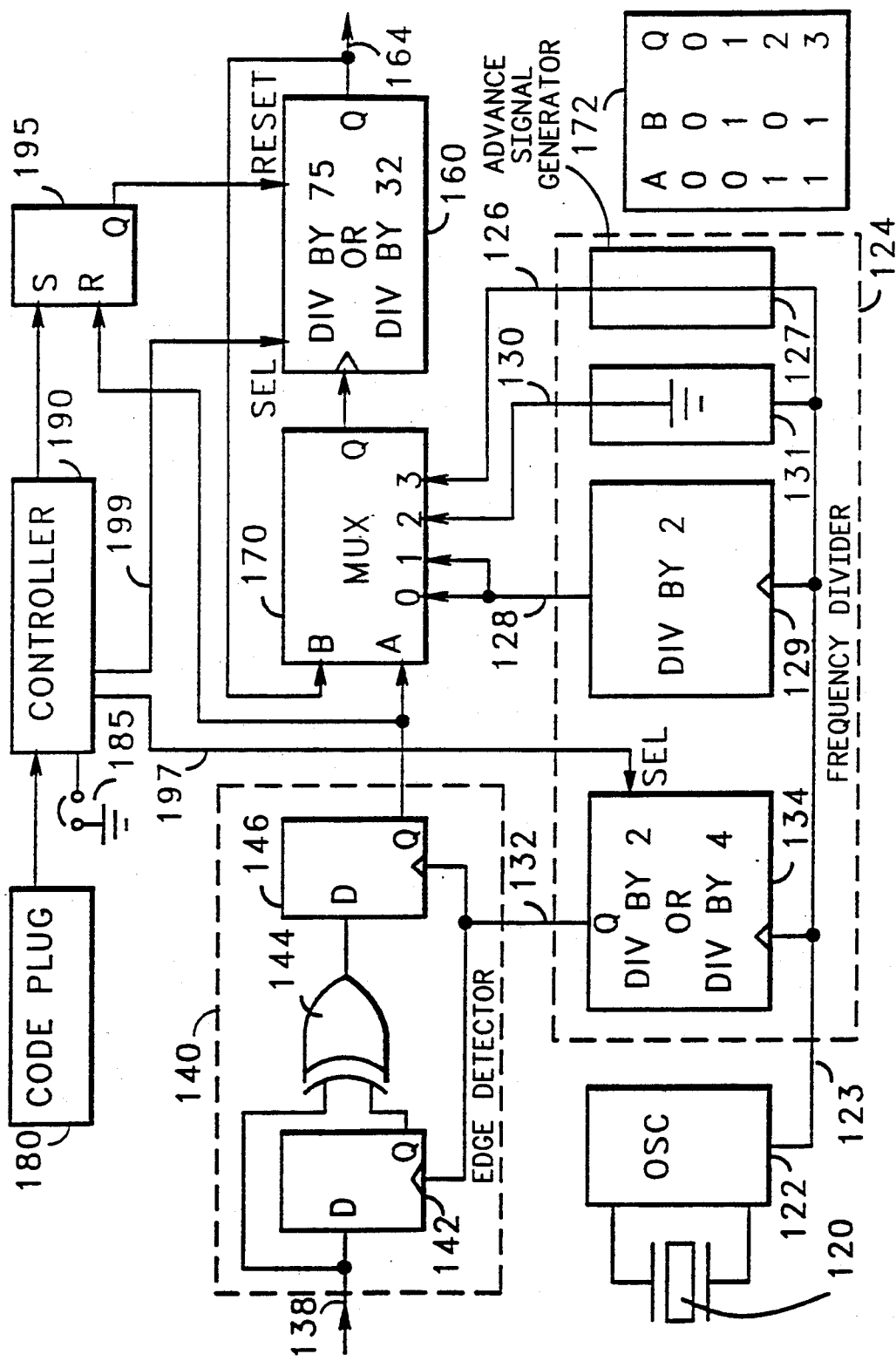
FIG. 2 shows a block diagram of a digital phase locked loop arrangement for a paging receiver in accordance with the present invention.

The preferred embodiment is implemented as part of a single chip decoder bipolar integrated circuit. The decoder IC is preferably implemented using Integrated Injection Logic (I²L) which provides good low voltage and low current performance necessary for use in paging receivers. The implementation of the logic circuits of the invention using I²L technology is well known in the art. It can be appreciated that in an alternate embodiment logic circuits may also be implemented in CMOS, TTL or other technologies while still remaining within the scope of the invention;

FIG. 2 shows a block diagram of the present invention. The DPLL is driven by a crystal 120 which oscillates at a frequency of approximately 76,800 Hz. The crystal is driven by oscillator means 122 which produce a reference signal 123. The frequency of the reference signal is 76,800 Hz in the preferred embodiment. In an alternate embodiment the oscillator means 122 may include a divide means which could divide the crystal frequency by an integer value greater than one, in order to produce the a reference signal having a frequency different from the crystal frequency.

The reference signal is used by frequency dividing means 124 which is shown enclosed within a broken line. Frequency dividing means 124 produces an advance signal 126, a nominal signal 128 and a retard signal 130. In the preferred embodiment means 127 for generating advance signal 126 provides an advance signal having a frequency equal to the frequency of the reference signal. Means 129 for producing the nominal signal 128, provides a nominal signal having a frequency equal to the reference signal divided by two. Means 131 for producing the retard signal 130, provides a retard signal having a frequency equal to the zero Hz, or a logical zero. It can be appreciated that in alternate embodiments, means 127, 129 and 131 can produce advance, nominal and retard signals respectively by dividing the reference signal by different values, in a known manner, while still remaining within the scope of the invention.

The frequency dividing means 124 also provides a sample signal 132. The sample signal is derived from the reference signal by a programmable divider 134. In the preferred embodiment the programmable divider 134 is programmed to divide by two if the data rate is 1200 bits per second, or is programmed to a divide by four if the data rate is 512 bits per second. As will be detailed later, deriving the sample clock in this manner adjusts the bandwidth of the DPLL. It can be appreciated that in alternate embodiments the other divide values for programmable divider 134 resulting in alternate DPLL bandwidths may be used while remaining within the scope of the invention.

Data signal 138 represents the received POCSAG binary signal. Data signal 138 and sample signal 132 are fed into edge detector means 140. Edge detector means includes a "D" flip flop 142 which is clocked by the sample signal 132. The input to the flip flop is the data signal 138. Flip flop 142 acts as a digital delay which delays a sample of the data signal for one cycle of the sample signal. The output of flip flop 142 as well as data signal 138 are applied to the inputs of XOR gate 144. The output of the XOR gate is fed to the input of a second "D" flip flop 146. In the operation of the edge detector, and edge signal 148 is produced by flip flop 146 for one cycle of the sample signal in response to data signal 138 having a binary transition.

The DPLL includes a second programmable divider 160 which divides an output signal 162 by a programmable integer value in order to produce a bit clock signal 164. In the preferred embodiment the programmable divider 160 is programmed to divide by thirty two if the data rate is 1200 bits per second, or divide by seventy five if the data rate is 512 bits per second. It can be appreciated that in alternate embodiments other divide values for programmable divider 160 resulting in alternate DPLL bit rates may be chosen.

The bit clock signal 164 is fed back to selecting means 70. Selecting means 170 is additionally responsive the the edge signal 148. Selecting means 170 may be considered a multiplexer (MUX) with address signals being the bit clock signal 164, input A of the MUX, and edge signal 148 input B of the MUX. The data inputs may be considered the advance signal 26 which is coupled to input 3 of the MUX, and the nominal signal 128 which is coupled to inputs 0 and 1 of the MUX, and the retard signal 130 which is coupled to input 2 of the MUX. The output signal 162 of the MUX is the signal input to programmable divider 160. Truth table 172 defines the operation of the selecting means 170. In the absence of an edge signal 48, the output signal 162 is selected to be equal to the nominal signal 128. This is shown in table 172 by AB being equal to either 00 or 01 wherein the output is selected to be either input 0 or 1, both of which are connected to nominal signal 128. Furthermore, table 172 shows that in the presence of the edge signal the output is selected to be the advance signal 126 if the bit clock signal is a one, or the retard signal 130 if the bit clock signal is a zero. This is shown in table 172 by AB being equal to either 10 or 11 respectively.

The process of phase locking of the DPLL is graphically shown in FIG. 3 with timing diagrams. Line 200 of FIG. 3 represents data signal 138 of FIG. 2. Event 202 represents an edge transition on the data signal. Line 205 represents edge signal 148 of FIG. 2 generated as a result of transition 202. Three relative phases between the edge signal 205 and the bit clock signal 164 of FIG. 2 are shown by lines 210a, 210b and 210c, and the resulting output signal 162 of FIG. 2 are shown by lines 215a, 215b, 215c.

Edge signal 205 is low during interval 206. At event 202, a data transition occurs on data signal 200. In response to the data transition, edges signal 205 goes high for interval 207 and returns low for interval 208. Interval 207 corresponds to the period of the sample signal 132.

Line 210a shows a negative phase relationship between edge signal 207 and the transition of the bit clock signal 210a shown by event 212a. During interval 206, the output signal 215a is equivalent to the nominal signal. During interval 207, since the bit clock signal 210a is low, the retard signal is selected which is shown by the lack of pulses on line 215a during interval 207. During interval 208, the output signal returns to the nominal signal.

Interval 207 has the equivalent of two cycles of the nominal signal. The result of the phase relationship of 210a, two cycles of the nominal signal are effectively deleted during interval 207. This eliminates two counts from the counting means 160 of FIG. 2 which results in a phase shift in the "retarding" of the bit clock signal towards the edge signal on a subsequent data transition. After an adequate number of transitions this process "retarding" will result in phase lock.

Line 210b shows a positive phase relationship between edge signal 207 and the transition of the bit clock signal 210b shown by event 212b. During interval 206, the output signal 215b is equivalent to the nominal signal. During interval 207, since the bit clock signal 210b is high, the advance signal is selected which is shown by the four pulses on line 215b during interval 207. During interval 208, the output signal returns to the nominal signal.

Interval 207 has the equivalent of two cycles of the nominal signal. As a result of the phase relationship of 210b, four cycles occur during interval 207. This effectively adds two cycles to the nominal signal and results in a phase shift in the bit clock signal "advancing" towards the edge signal on a subsequent data transition. After an adequate number of transitions this "advancing" process will result in phase lock.

Line 210c shows a phase locked relationship between edge signal 207 and the transition of the bit clock signal 210c shown by event 212c. During interval 206, the output signal 215c is equivalent to the nominal signal. During the first part of interval 207, prior to transition 212c, the bit clock signal 210c is high and the advance signal is selected which is shown by the two pulses on line 215c. During the second part of interval 207, after transition 212c, the bit clock signal 210c is low and the retard signal is selected which is shown by the absence of pulses on line 215c. During interval 208, the output signal returns to the nominal signal.

Interval 207 has the equivalent of two cycles of the nominal signal. The phase relationship of 210c results in two cycles in the first portion and no cycles in the second portion of interval 207. Thus two cycles during interval 207 is equivalent to the two cycles which would have been generated by the nominal signal. Thus no net phase adjustment to the bit clock signal occurs with the phase relationship of 210c and the loop is considered phase locked.

Since phase adjustments only occur in response to a transition on the received data, the DPLL has the ability to synchronize on either the POCSAG preamble signal or the effectively random data bits within the POCSAG data signal. It can be appreciated that since the POCSAG preamble signal is an alternating 1,0 pattern, a data transition occurs with every bit. Consequently the DPLL will phase lock to the preamble signal in a minimal time. Additionally, the random data bits of the POCSAG data signal also provides data transitions relatively frequently thereby allowing the DPLL to phase lock within a somewhat longer time. The phase locking to either the preamble or data signals allows the DPLL to synchronize to the POCSAG signal whenever it is transmitted.

Bit clock signal 212 is generated substantially as a square wave where when the DPLL is phase locked the negative edge of the bit clock has a predetermined phase relationship with the edges of the data transitions. The positive edge of the bit clock signal is used to center sample the data bits. Note that since the positive edge of the bit clock is used, the output wave form 215c will result in no changes in phase of the positive edge of the bit clock signal with respect to the center of the bit.

It should be noted that the operation of this DPLL distinguishes over prior art lead/lag DPLLs. Lead/lag DPLLs act to constantly phase adjust the bit clock signal on every data transition. The DPLL of FIG. 2, once locked, does not change the phase of the bit clock. Instead, the present invention remains locked to the signal with an invariant phase of the bit clock from one data transition to the next.

In the circuit shown in FIG. 2, the MUX circuit 170 acts in response to a zero to one state change by edge signal 148 to select either advance signal 126, input A, or retard signal 130, input B, as the clock source for counter 160 during the period of time that A and B remain unchanged. This selection process has the effect of "advancing" or increasing the output frequency at 164 when A and B are both high, indicating the output phase of the loop is lagging. Alternately, when A is high and B is low, it has the effect of "retarding" or decreasing the output frequency at 164, indicating that the loop output phase is leading the input signal.

Since the signal at point A is derived from the edge detector means 140, which is clocked by the sample clock signal 132, it follows that signals on A will be present for integer multiples of the sample clock period.

When there are no transitions on data signal 138, the MUX 170 selects either of inputs 0 or 1 as clock sources for divider 160. In this mode, output signal 162 having a frequency equal to the reference frequency divided by two, $f_L/2$. The frequency of the bit clock signal 164 is $f_o$, which is $f_L/2N$, where N is the programmed divide modulus of counter 160. Thus:

$$f_o = f_L/2N$$

When the loop is out of lock, i.e. when the transitions of output signal 164 are not synchronized with the transitions of data signal 138, MUX 170 is driven to select either of inputs 2 or 3 as clock sources for programmable divider 160.

If input 3, the advance signal which has a frequency of $f_L$, is selected, programmable divider 160 is driven by a frequency of $f_L$ for a period of the sample clock frequency. If $$f_s = L \times f_o$$

That is, if there are L samples per bit interval. Then the number of clock pulses applied to the counter 160 during one cycle of the input signal is:

No. clock pulses =

$$= (f_L) \times \left(\frac{1}{L \times f_o}\right) + \left(\frac{f_L}{2}\right) \times \left(\frac{L-1}{L \times f_o}\right)$$

$$= \left(\frac{f_L}{2}\right) \times \left(\frac{1}{L \times f_o}\right) + \left(\frac{f_L}{2}\right) \times \left(\frac{1}{L \times f_o}\right) +$$

$$\left(\frac{f_L}{2}\right) \times \left(\frac{L-1}{L \times f_o}\right)$$

$$= \frac{f_L}{2 \times L \times f_o} + \frac{f_L}{2 \times f_o}$$

$$= \frac{f_L}{2 \times f_o} \times \left(1 + \frac{1}{L}\right)$$

Since these pulses would be applied in one bit period of the input signal, which is $1/f_o$, it follows that the maximum frequency output at pin 64 is:

$$f_{max} = \frac{1}{N} \text{ (pulses in one bit period)}$$

$$f_{max} = \frac{1}{N} \times f_o \times \frac{f_L}{2 \times f_o} \times \left(1 + \frac{1}{L}\right)$$

$$f_{max} = \frac{f_L}{2 \times N} \times \left(1 + \frac{1}{L}\right)$$

Similarly, if MUX input 2 which has a frequency of zero is selected by an input transition, the number of clock pulses applied to the counter 160 during one cycle of the input signal is:

No. clock pulses =

$$= (0) \times \left(\frac{1}{L \times f_o}\right) + \left(\frac{f_L}{2}\right) \times \left(\frac{L-1}{L \times f_o}\right)$$

$$= \left(\frac{f_L}{2 \times f_o}\right) \times \left(1 - \frac{1}{L}\right)$$

Since these pulses would be applied in one bit period, the average minimum frequency at bit clock signal 164 is:

$$f_{min} = \frac{1}{N} \text{ (pulses in one period)}$$

$$f_{min} = \frac{1}{N} \times f_o \times \frac{f_L}{2 \times f_o} \times \left(1 - \frac{1}{L}\right)$$

$$f_{min} = \left(\frac{f_L}{2N}\right) \times \left(1 - \frac{1}{L}\right)$$

When the equations for $f_o$, $f_{max}$, and $f_{min}$ are subtracted to obtain the positive, negative and total tracking bandwidths, we have:

$$+BW = f_{max} - f_o = f_L/2NL$$

$$-BW = f_o - f_{min} = f_L/2NL$$

$$\text{Total } BW = f_{max} - f_{min} = f_L/NL$$

Since $f_L = Kf_s = KLf_o$, $$\text{Total } BW = Kf_o/N$$

and the bandwidth as a fraction of the center frequency $f_o$ is:

$$\text{Fractional } BW = K/N$$

which is independent of center frequency.

The above expression for fractional bandwidth represents a valuable advancement over the current state-of-the-art systems which provide a fractional bandwidth of the form:

$$\text{Fractional } BW = 1/N$$

The addition of the K factor in the bandwidth expression for the current invention provides a means for maintaining a constant fractional bandwidth over a range of output frequencies which translates to a range of N values. For example, prior art systems with a loop with a 4:1 output frequency range would suffer from a 4:1 variation in fractional bandwidth, the fractional bandwidth could be maintained close to a fixed value by varying the value of K—the modulus of the divider 134.

To illustrate the advantages offered by this new configuration, an example system for synchronizing to 1200 baud and 512 baud POCSAG signals will be described.

For this application, it has been determined that the optimum value of L, considering circuit complexity, power drain and performance, is around 32. That is, the sample clock should be about 32 times the bit rate of the received signal. Further, a reference frequency of 76.800 KHz has also been determined to be more optimum. For these values:

$$f_o = 76.8\ KHZ/2N$$

$$f_s = f_L/K = 2Nf_o/K$$

$$BW = Kf_o/N$$

$$Fractional\ BW = K/N$$

Thus, selecting the value of (2N/K) to be approximately 32 will give a fractional bandwidth of 0.0625, or 6.25%, which is near optimum for requiring POCSAG signals. For the 512 baud rate, selecting N=75, K=4 gives:

$$f_o = 76.8\ KHz/2(75) = 512\ Hz$$

$$f_s = 76.8\ KHz/4 = 19.2\ KHz = 37.5 \times (512\ Hz)$$

$$BW = 4/75 \times (512) = 27\ Hz$$

$$Fractional\ BW = 4/75 = 0.05333$$

For use with 1200 baud signals, switching the value of K to 2 and N to 32 gives:

$$f_o = 76.8\ KHz/2 \times (32) = 1200\ Hz$$

$$f_s = 76.8\ KHz/2 = 38.4\ KHz = 32 \times (1200\ Hz)$$

$$BW = 2/32 \times (1200) = 75\ Hz$$

$$Fractional\ BW = 2/32 = 0.0625$$

The fractional BW only varies from 0.0533 to 0.0625 for these parameters. With the prior art systems, this bandwidth parameter would vary by a ratio of 1200/512, or 2.34 to 1 versus the 1.17 to 1 performance provided by this invention.

Thus the DPLL can operate at a data rate of either 512 bits per second or 1200 bits per second with effectively the same fractional BW. Referring back to FIG. 2, the selection between the two data rates is made by setting a bit in the pager's code plug 180, which serves as a memory means and which is typically a programmable read only memory. While in the preferred embodiment, the selection between the two data rates is made by a memory means comprising a printed circuit board jumper 185. Jumper 185 being installed corresponds to 512 bits per second while when the jumper is opened, the selected bit rate corresponds to 1200 bits per second. Either the bit in the code plug or the jumper means is read by controller 190. Controller 190 then generates signal 197 which causes the programmable divider 134 to divide by four if the data rate is 512 bps or to divide by two if the data rate is 1200 bps. Similarly, controller 190 send signal 199 which causes programmable divider 160 to divide by seventy five if the data rate is 512 bps or to divide by thirty two if the data rate is 1200 bps.

It can be appreciated that the signals 197 and 199 may be combined and may be a common logical one or zero for 1200 bps or 512 bps respectively. By making such a combination, both the lock frequency of the DPLL and the percent bandwidth of the DPLL may be simultaneously changed with a single binary state from the controller 190. This has the further benefit of reducing the amount of circuitry necessary to control the DPLL and simplifies its operation.

It can be further appreciated that normally several transitions of the data signal are required to initially lock the DPLL to the data signal. This is the result of an initially random phase relationship between the data signal and the bit clock signal. More rapid locking can be accomplished by setting the bit clock signal to a predetermined phase relationship with a first data signal transition. The ideal phase relationship would be that shown by line 210c of FIG. 3. This is accomplished with the flip flop 195 of FIG. 2. When the pager is initially acquiring bit synchronization, controller 190 sets flip flop 195. This causes the output of the flip flop to set a predetermined count in the programmable divider 160 and halt the counting. In response to an edge signal, flip flop 195 releases programmable divider 160 from the reset state and the divider begins counting. This sequence of events has the effect of initializing the bit clock signal in a phase locked condition on the first edge of a transition of the data signal.

While the above principles of the invention have been described with a specific apparatus, it is to be clearly understood that this description is made by way of example only and not a limitation to the scope of the invention as set forth in the accompanying claims.

What is claimed is:

1. A digital phase locked loop for bit synchronizing to a binary signal having a predetermined bit rate, said digital phase locked loop comprising:

oscillator means for producing a reference signal having a predetermined frequency; frequency generating means responsive to the reference signal for generating an advance signal, a nominal signal, a retard signal and a sample signal wherein each generated signal is derived from the reference signal;

edge detecting means coupled to receive the binary signal and responsive to the sample signal for generating an edge signal having a period corresponding to one cycle of the sample signal in response to a transition of the binary signal;

dividing means for producing a bit clock signal having a frequency substantially equal to the bit rate; and selecting means generating an output signal, wherein the output signal is selected to be equivalent to the nominal signal in the absence of the edge signal, and the output signal is selected to be equal to either the advance signal or the retard signal in the presence of the edge signal, wherein the advance signal is selected in response to the the clock being in a first state and the retard signal is selected in response to the bit clock being in a second state; further wherein said dividing means produces the bit clock as a function of the output signal.

2. The digital phase locked loop of claim 1 further wherein;

said frequency dividing means includes a first programmable integer divider for generating the sample signal by dividing the reference signal by a first programmable integer; and said dividing means includes a second programmable integer divider for dividing the output signal by a second programmable integer in order to produce the bit clock; the digital phase locked loop further comprising:

control means for programming said first and second programmable integer dividers.

3. The digital phase locked loop of claim 2 further comprising:

memory means for storing information for the first and second programmable integers for said first and second programmable integer dividers.

4. The digital phase locked loop of claim 3 further wherein;
said first programmable divider selectively divides by either a first predetermined value or a second predetermined value;
said second divider selectively divides by either a third predetermined value or a fourth predetermined value;
said memory means has one binary state for storing information for selecting the predetermined values for said first and second dividers; and
said control means selects the first and third predetermined values in response to the binary state being in a first state, an said control means selects the second and fourth predetermined values in response to the binary state being in a second state.

5. The digital phase locked loop of claim 4 further wherein;
the reference frequency is 76,800 cycles per second;
the first predetermined value is two;
the second predetermined value four;
the third predetermined value thirty two; and
the fourth predetermined value is seventy five,
thereby providing providing a digital phase locked loop which based upon the bit in the memory means locks to a data rate of either 512 bits per second or a data rate or 1200 bits per second wherein a fractional bandwidth of the digital phase locked loop is substantially constant over both of said bit rates.

6. The digital phase locked loop of claim 3 wherein said memory means comprises a programmable read only memory.

7. The digital phase locked loop of claim 3 wherein said memory means comprises a jumper on a printed circuit board.

8. The digital phase locked loop of claim 1 further comprising:
control means for producing a start signal for initiating operation of the digital phase locked loop; and
initializing means responsive to the start signal and the edge signal for initializing said dividing means to a predetermined value in response to the first edge signal subsequent to the start signal.

9. A method of controlling a receiver having a digital phase locked loop capable of being programmed to lock onto either a first or second predetermined data rate, the digital phase locked loop further capable of being programmed to operate with either a first or second bandwidth, the receiver additionally having a memory means having a first and second state for determining the operation of the digital phase locked loop, the method comprising the steps of;
reading the memory means and determining the state thereof;
programming the digital phase locked loop to lock onto the first data rate and to operate at the first bandwidth if the memory means is in the first state, the first bandwidth having a first fractional bandwidth associated with the first data rate which is substantially equal to a second fractional bandwidth associated with the second data rate; and
programming the digital phase locked loop to lock onto the second data rate and to operate at the second bandwidth if the memory means is in the second state.

10. A method of controlling a receiver having a digital phase locked loop capable of being programmed to lock onto either a first or second predetermined data rate, the digital phase locked loop further capable of being programmed to operate with either a first or second bandwidth, the receiver additionally having a memory means having a first and second state for determining the operation of the digital phase locked loop, the method comprising the steps of;
reading the memory means and determining the state thereof, the memory means comprising at least one bit within a programmable memory;
programming the digital phase locked loop to lock onto the first data rate and to operate at the first bandwidth if the memory means is in the first state; and
programming the digital phase locked loop to lock onto the second data rate and to operate at the second bandwidth if the memory means is in the second state.

11. A method of controlling a receiver having a digital phase locked loop capable of being programmed to lock onto either a first or second predetermined data rate, the digital phase locked loop further capable of being programmed to operate with either a first or second bandwidth, the receiver additionally having a memory means having a first and second state for determining the operation of the digital phase locked loop, the method comprising the steps of:
reading the memory means and determining the state thereof, the memory means comprising at least one printed circuit board jumper;
programming the digital phase locked loop to lock onto the first data rate and to operate at the first bandwidth if the memory means is in the first state; and
programming the digital phase locked loop to lock onto the second data rate and to operate at the second bandwidth if the memory means is in the second state.

* * * * *

UNITED STATES PATENT AND TRADEMARK OFFICE
CERTIFICATE OF CORRECTION

PATENT NO. : 5,111,486

DATED : May 5, 1992

INVENTOR(S) : Oliboni et al.

It is certified that error appears in the above-identified patent and that said Letters Patent is hereby corrected as shown below:

Column 10, line 45, after "edge", insert --pulse--.

Column 10, line 49, delete "the" (second occurrence) and insert --bit--.

Column 11, line 28, delete "providing" (second occurrence).

Signed and Sealed this

Third Day of August, 1993

Attest:

MICHAEL K. KIRK

*Attesting Officer*    Acting Commissioner of Patents and Trademarks